(12) United States Patent
Pilolli

(10) Patent No.: US 12,242,400 B2
(45) Date of Patent: *Mar. 4, 2025

(54) MEMORY DEVICE INTERFACE COMMUNICATING WITH SET OF DATA BURSTS CORRESPONDING TO MEMORY DIES VIA DEDICATED PORTIONS FOR COMMAND PROCESSING

(71) Applicant: Lodestar Licensing Group LLC, Evanston, IL (US)

(72) Inventor: Luigi Pilolli, L'Aquila (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,488

(22) Filed: Feb. 20, 2024

(65) Prior Publication Data

US 2024/0248859 A1 Jul. 25, 2024

Related U.S. Application Data

(63) Continuation of application No. 17/825,632, filed on May 26, 2022, now Pat. No. 11,934,325, which is a continuation of application No. 17/081,483, filed on Oct. 27, 2020, now Pat. No. 11,347,663.

(51) Int. Cl.
  *G06F 13/16* (2006.01)
  *G06F 13/22* (2006.01)
  *G06F 13/28* (2006.01)
  *G06F 13/40* (2006.01)

(52) U.S. Cl.
  CPC ...... *G06F 13/1668* (2013.01); *G06F 13/1615* (2013.01); *G06F 13/22* (2013.01); *G06F 13/28* (2013.01); *G06F 13/4068* (2013.01)

(58) Field of Classification Search
  CPC .. G06F 13/1668; G06F 13/1615; G06F 13/22; G06F 13/28; G06F 13/4068
  See application file for complete search history.

(56) References Cited

U.S. PATENT DOCUMENTS

| | | | |
|---|---|---|---|
| 11,347,663 B2 | 5/2022 | Pilolli | |
| 11,934,325 B2 | 3/2024 | Pilolli | |
| 2005/0024980 A1 | 2/2005 | Roohparvar | |
| 2015/0186075 A1 | 7/2015 | Roberts | |
| 2017/0358327 A1 | 12/2017 | Oh et al. | |
| 2018/0136878 A1 | 5/2018 | Madpur et al. | |
| 2020/0272567 A1 | 8/2020 | Gans | |
| 2022/0129396 A1 | 4/2022 | Pilolli | |
| 2022/0283965 A1 | 9/2022 | Pilolli | |
| 2024/0248859 A1* | 7/2024 | Pilolli | ..... G06F 13/22 |

OTHER PUBLICATIONS

PCT Notification of Transmittal of the International Search Report and Written Opinion of the International Searching Authority for PCT Application No. PCT/US2021/056509, mailed Feb. 25, 2022, 16 pages.

* cited by examiner

*Primary Examiner* — Tammara R Peyton
(74) *Attorney, Agent, or Firm* — Dorsey & Whitney LLP

(57) ABSTRACT

A first command associated with a first memory die is communicated via a first portion of an interface of the memory sub-system. A second command associated with a second memory die is communicated via the first portion of the interface to a second memory die. A data burst corresponding to the first memory die is caused to be communicated via a second portion of the interface, where the second command is communicated via the first portion of the interface concurrently with the data burst communicated via the second portion of the interface.

20 Claims, 6 Drawing Sheets

MEMORY DEVICE INTERFACE COMMUNICATING WITH SET OF DATA BURSTS CORRESPONDING TO MEMORY DIES VIA DEDICATED PORTIONS FOR COMMAND PROCESSING

CROSS-REFERENCE TO RELATED APPLICATION

This application is a continuation of U.S. patent application Ser. No. 17/825,632 filed May 26, 2022, and issued as U.S. Pat. No. 11,934,325 on Mar. 19, 2024, which is a continuation of U.S. patent application Ser. No. 17/081,483, filed on Oct. 27, 2020, and issued as U.S. Pat. No. 11,347,663 on May 31, 2022. The aforementioned applications, and issued patents, are incorporated herein by reference, in their entirety, and for any purpose.

TECHNICAL FIELD

Embodiments of the disclosure relate generally to memory sub-systems, and more specifically, relate to a memory device interface with a dedication portion for command processing.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
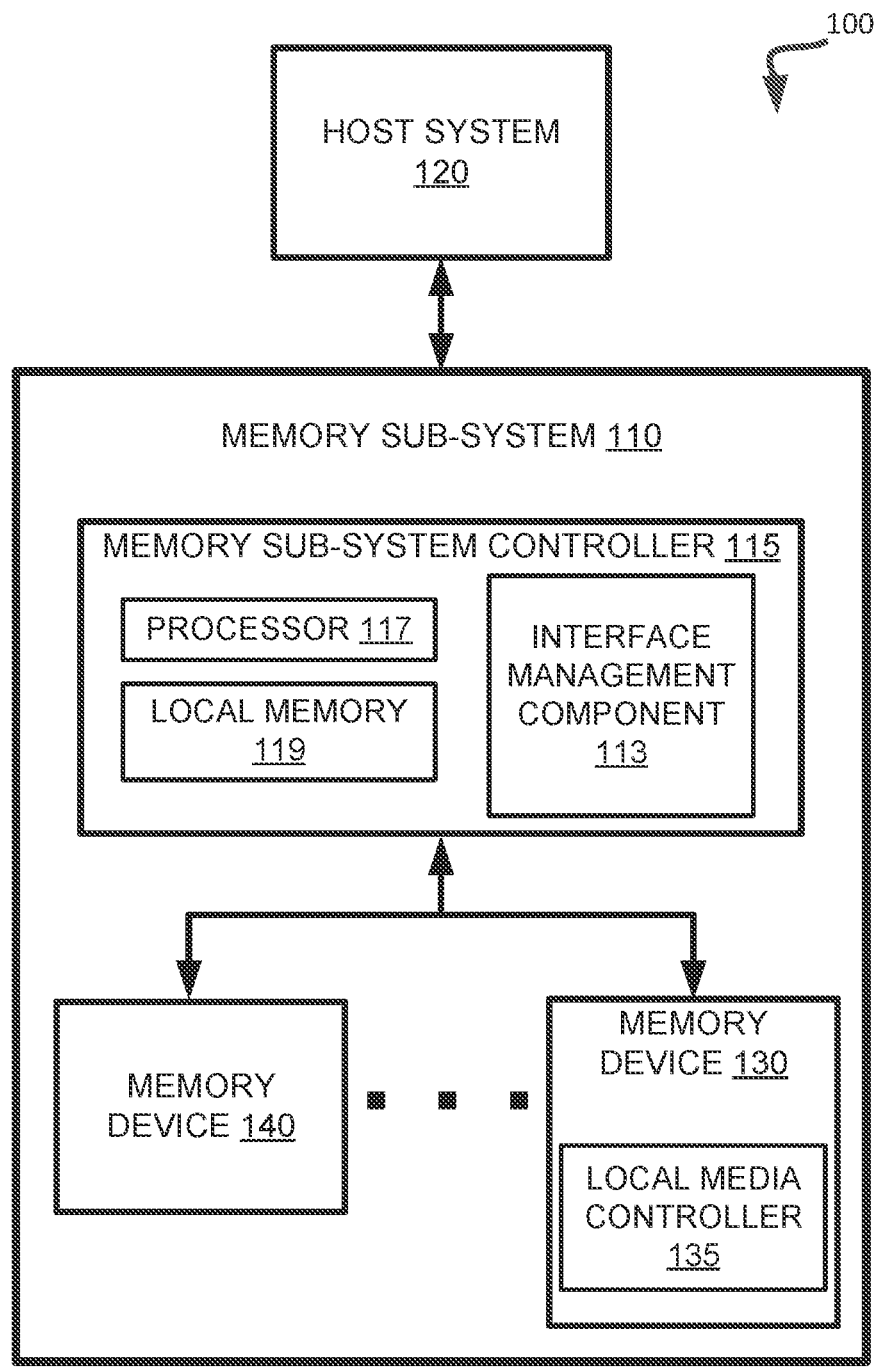
FIG. 1 illustrates an example computing environment that includes a memory sub-system in accordance with some embodiments of the present disclosure.

Aspects of the present disclosure are directed to an active input/output (IO) expander of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory sub-system can include an interface between a controller of the memory sub-system and a memory device to process multiple different signals relating to one or more transfers or communications with the memory device. For example, the interface processes signals relating to memory access commands (e.g., command/address cycles) to configure the memory device to enable the transfer of raw data in connection with a memory access operation (e.g., a read operation, a program operation, etc.). In addition, the interface (e.g., the input/output (I/O) or main data bus) processes the transfer of sets of data (e.g., a data cycle also referred to as a "data burst") between the memory device and the host system in connection with the various memory access commands. For example, the interface handles the communications including raw memory data from the host system to the memory device (e.g., data input bursts and communications including raw memory data from the memory device to the host system (e.g., data output bursts).

Certain memory sub-system interfaces include a main interface bus that is shared between the input/output data burst communications with the memory devices and the command communications between the controller and the memory devices. In these systems, the interfaces (e.g., an Open NAND Flash Interface (ONFI)) are configured to process memory device commands (e.g., command/address cycles) and data burst communications serially. Since both commands and data bursts require the use of the main interface bus, it can only be used alternatively for processing commands or data bursts. Accordingly, when processing a command via the interface, the command/address cycle needs to complete before a data burst communication can be processed by the interface. Furthermore, when the interface is issuing a data burst to the memory device via the interface, the interface cannot concurrently process a memory access command. In addition, these interfaces are configured to process status polling communications (e.g., the transmission of communications to respective memory devices to check on the status of previously issued memory access operations) in addition to the memory device commands and data burst communications. Accordingly, the shared interface requires the controller to select one of the status polling, memory device command, or data burst communications to transmit via the interface at a time, since no parallel processing is enabled.

In addition, certain memory sub-systems include multi-plane memory devices wherein memory access operations can be performed concurrently on separate planes of the multi-plane memory device. In such systems, each multi-plane memory device can include multiple processing devices configured to process multiple memory access operations at different time frames. For example, these systems can process a read operation of a memory device in one plane, and after a predetermined delay, process another read operation to the same memory device in a different plane. However, memory devices that are able to accept a command in these asynchronous multi-plane processing systems may be prohibited from doing so due to a concurrent data burst on the same channel, thereby resulting in delayed execution.

Aspects of the present disclosure address the above and other deficiencies by a memory sub-system including a memory device interface configured with a first portion designated or assigned for processing memory access commands and a second portion designated or assigned for processing data bursts. In an embodiment, the memory device interface includes the first portion having one or more pins that are assigned to transmit memory device commands (e.g., command/address cycles) associated with one or more memory devices of the memory sub-system. A controller of the memory sub-system identifies a memory device command associated with a memory die of the memory device the controller processes the memory device command using the first portion of the memory device interface (also referred to a "command interface" or "command interface portion"). In an embodiment, the command interface can be used by the controller to transmit status polling communications to the one or more memory devices.

The interface includes a second portion having one or more pins assigned to process data burst communications (herein referred to as a "data burst interface" or "data burst interface portion". In response to identifying a data burst communication, the controller causes processing of the data burst communication via the designated data burst interface portion of the memory device interface.

In an embodiment, the interface can include a third portion of the interface assigned or dedicated to the processing of the status polling communications. In this embodiment, the third portion of the interface (also referred to as a "status polling interface") can be implemented by assigning an existing one or more pins of the interface to the processing of status polling communications or by adding an additional one or more pins to the interface for processing the status polling communications.

In addition, advantages of the present disclosure include, but are not limited to, the concurrent processing of commands and data bursts. Furthermore, the dedicated command and data burst interfaces enable the parallel processing of data burst communications during status polling communications. Another advantage of the dual interface is that the data interface is not utilized when issuing a command via the command interface, thereby avoiding consumption of the leakage current by each of the memory devices associated with the same channel. As such, using the dedicated command interface enables memory device management wherein only a selected memory device is turned on results in consumption of leakage current by only a selected memory device (e.g., the memory device that is receiving the issued command from the controller), thereby resulting in idle state current consumption savings.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an interface management component 113 to process communications using a memory device interface having a first portion dedicated to processing commands (also referred to as a "command interface") and a second portion dedicated to processing data bursts (also referred to a "data burst interface") associated with the memory devices 140, 130. In some embodiments, the controller 115 includes at least a portion of the interface management component 113. For example, the controller 115 can include a processor 117 (processing device) configured to execute instructions stored in local memory 119 for performing the operations described herein. In some embodiments, the interface management component 113 is part of the host system 120, an application, or an operating system.

The interface management component 113 manages the command interface to process the one or more commands transmitting from the controller 115 to one or more memory devices coupled to the command interface via a common or shared channel. In operation, when a new command associated with a target memory die of a target memory device is issued, the command is transmitted to the target memory device via the command interface.

In an embodiment, the interface management component 113 also manages the data burst interface to process the one or more sets of raw data corresponding to one or more memory access operations (e.g., a read operation, a program operation, etc.) between the memory devices 140, 130 and the host system 120. In operation, when a data burst associated with memory access operation is to be transmitted, the data burst is transmitted to a target memory device via the data burst interface. Advantageously, the command interface and the data burst interface are independent from one another and, as such, can be used concurrently. This enables the controller 115 to process commands and data bursts in parallel using the respective command interface and data burst interfaces. In an embodiment, the controller 115 can transmit status polling communications via the command interface, thereby enabling the processing of status polling and data bursts. In an embodiment, the interface can include an additional portion that is dedicated to the servicing of status polling by the controller 115. In this embodiment, a pin of the interface can be assigned or designated for processing status polling communications or an additional pin can be added to service the status polling communications.

Advantageously, the interface management component 113 can cause the concurrent or parallel transmission of commands via the command interface and data bursts via the data burst interface. The independent command interface maximizes efficiency by enabling use of the data bus for data burst communications only. In addition, the use of the command interface or a dedicated status polling interface to poll the memory devices for status and execute get operations (e.g., get feature data operations, get trim data operations, etc.) concurrently with the transmission of data bursts via the data burst interface.

Figure 2:
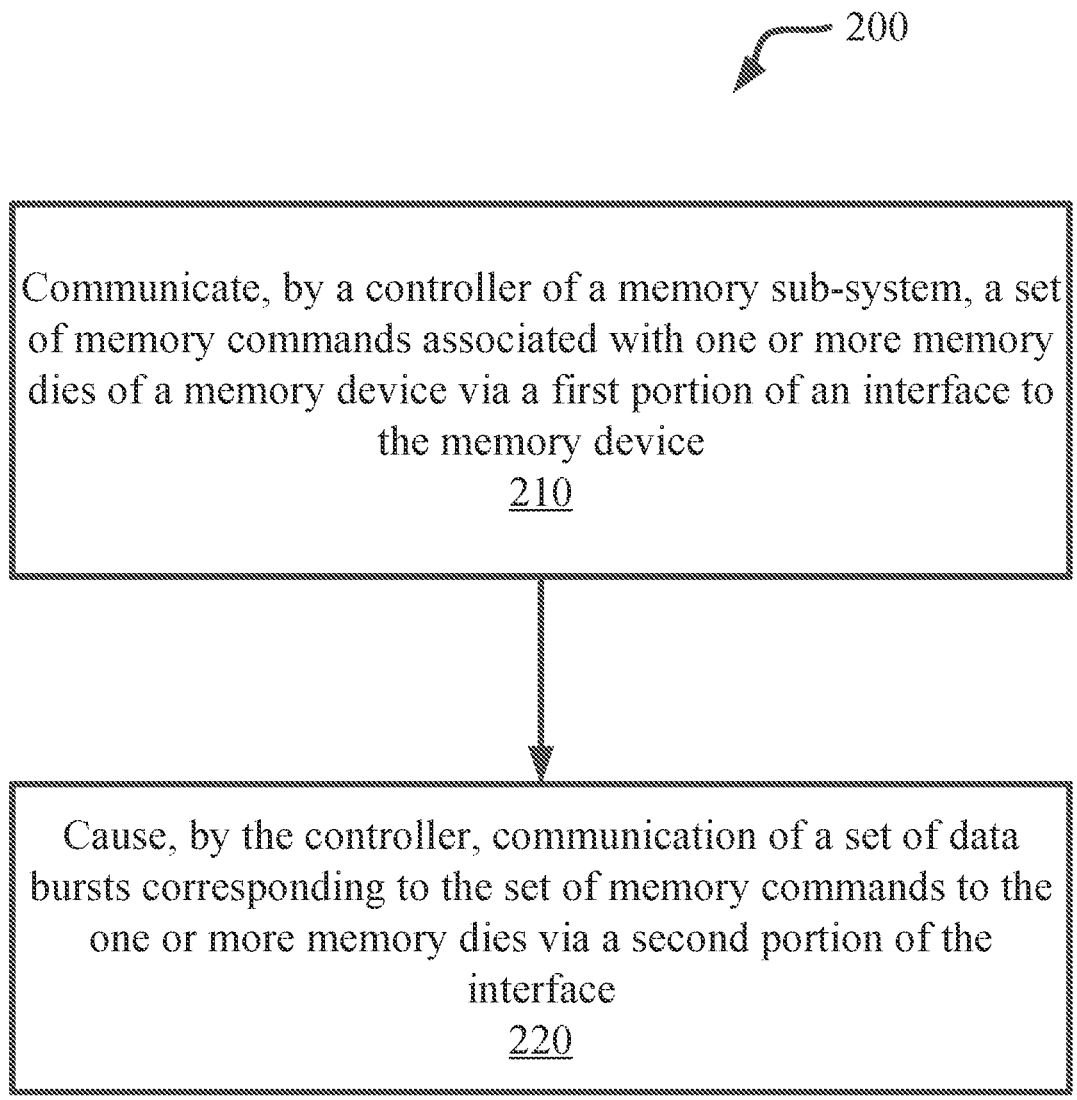
FIG. 2 is a flow diagram of an example method to manage communications with a memory device using an independent command interface in accordance with some embodiments of the present disclosure.

FIG. 2 is a flow diagram of an example method 200 to manage communications with a memory device using an independent command interface, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the interface management component 113 of FIG. 1.

At operation 210, a command is communicated to a memory device via a portion of an interface. For example, the processing logic of a controller of a memory sub-system communicates a set of memory device commands associated with one or more memory dies of a memory device via a first portion of an interface to the memory device. In an embodiment, a memory device interface enabling communications between the controller and one or more memory devices includes the first portion (also referred to as a "command interface" or "command interface portion"). In an embodiment, the first portion (e.g., the command interface) is designated by the processing logic for processing commands from the controller to the one or more memory devices. In an embodiment, the processing logic establishes the command interface by assigning one or more pins to transmitting memory device commands (e.g., command/address cycles) associated with one or more memory devices of the memory sub-system. In an embodiment, the set of memory commands can include command cycles and address cycles from the controller to prepare or configure the memory device (also referred to as a "target memory device"). For example, the processing logic can assign one or more of the pins of an interface (e.g., an Address Latch Enable (ALE) pin, a Command Latch Enable (CLE) pin, and a Write Enable (WE #) pin) for dedicated use for processing the memory device commands. In an embodiment, the command interface portion can further be used to transmit status polling communications to the one or more memory devices.

At operation 220, a data burst is communicated to the memory device via another portion of the interface. For example, the processing logic of a controller can cause communication of a set of data bursts corresponding to the set of memory device commands to the one or more memory dies via a second portion of the interface, wherein one or more of the set of memory commands is communicated via the first interface concurrently with one or more of the set of data bursts. In an embodiment, a memory device interface enabling communications of the one or more data bursts associated with host-initiated memory access operations via the second interface portion (also referred to as a "data burst interface" or "data burst interface portion"). In an embodiment, the second portion (e.g., the data burst interface) is designated by the processing logic for processing data input bursts (e.g., sets of data from the host system to a target memory die) and data output bursts (e.g., sets of data from a target memory die). In an embodiment, the processing logic designates or assigns one or more pins associated with a main interface bus (e.g., a bidirectional data bus or DQ bus pin and data strobe signal (DQS) pin of the interface) to transmit the data bursts between the host system and the memory device in connection with the execution of memory access operations.

In an embodiment, the processing logic and use the command interface portion and the data burst interface portion in parallel. As such, operations 210 and 220 can be performed at the same time, such that one or more commands are communicated via the command interface portion concurrently with one or more data bursts are communicated via the data burst interface portion.

Figure 3:
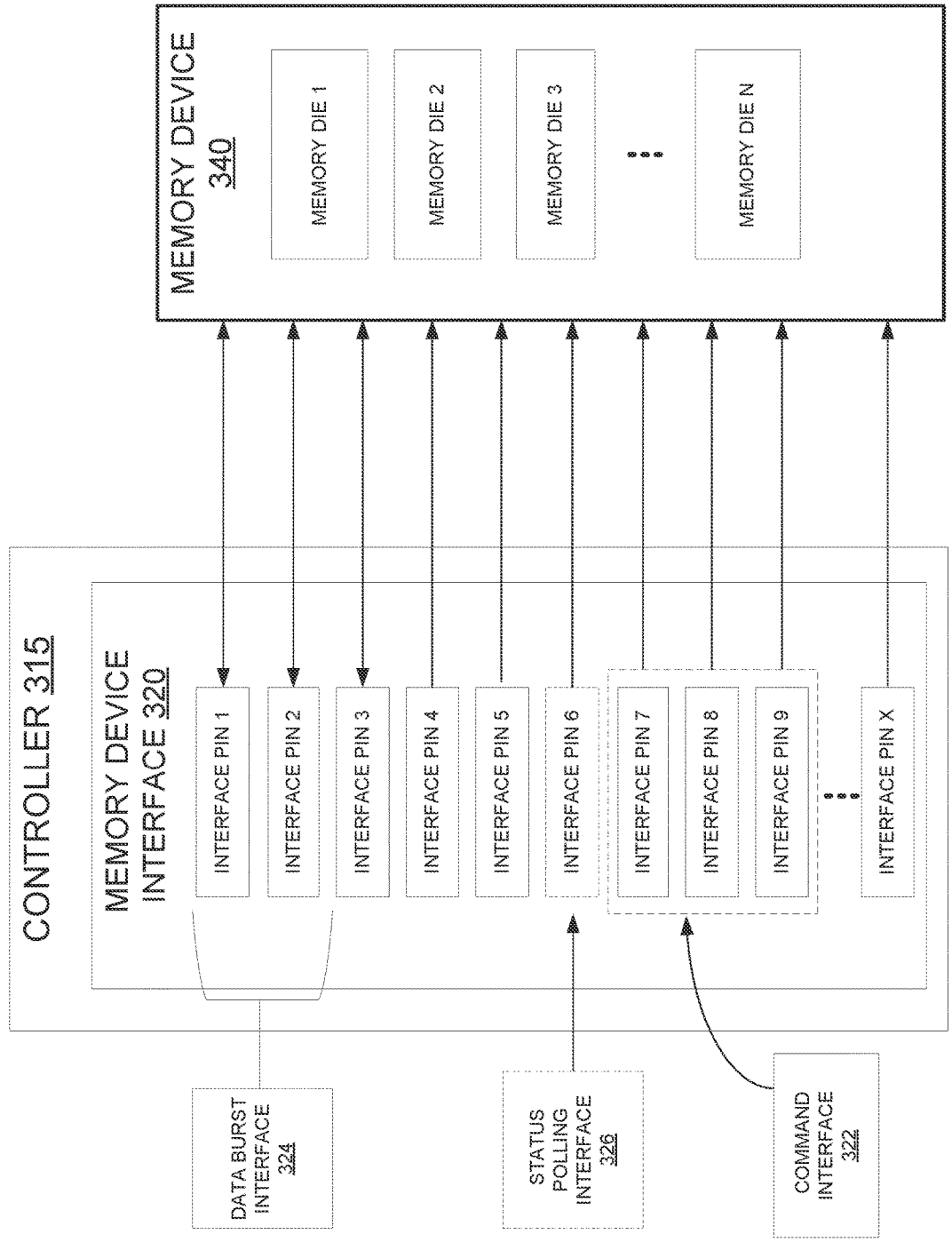
FIG. 3 illustrates an example controller including a memory device interface with a command interface portion in accordance with some embodiments of the present disclosure.

FIG. 3 illustrates an example controller 315 including a memory device interface 320 coupled to a memory device 340 including a set of memory dies (e.g., memory die 1, memory die 2, memory die 3 . . . memory die N), according to embodiments. The memory device interface 320 includes a set of interface pins (e.g., interface pin 1, interface pin 2

... interface pin X). In an embodiment, the memory device interface 320 includes a command interface 322 including a first portion of the interface pins (e.g., interface pin 7, interface pin 8, and interface pin 9) assigned or dedicated to processing commands from the controller 315 to the memory device 340. In an embodiment, the command interface 322 is an independent portion of the memory device interface 320 which is used by the controller 315 to transmit memory device commands (e.g., command/address cycles) associated with one or more memory dies of the memory device 340. In an example, the command interface 322 can include an Address Latch Enable (ALE) pin, a Command Latch Enable (CLE) pin, and a Write Enable (WE #) pin for dedicated use for processing the memory device commands. Although not shown in FIG. 3, it is noted that multiple memory devices can be connected to the memory device interface 320.

As shown in FIG. 3, the memory device interface 320 also includes a data burst interface 324 including a second portion of the interface pins (e.g., interface pin 1 and interface pin 2) assigned or dedicated to processing data bursts between a host system and the memory device 340. In an embodiment, a portion of the memory device interface 320 associated with a main I/O or data bus (e.g., DQ and DQS interface pins) can be used to transmit the data bursts between the host system and the memory device 340. Advantageously, as illustrated in FIG. 3, the use of the independent command interface 322 for servicing the command communications enables the concurrent transmission of commands (via the command interface 322) and the data bursts (via the data burst interface).

In an embodiment, the command interface 322 can further be used to transmit status polling communications to the memory device 340. This enables the concurrent processing of status polling communications and data burst communications. In an embodiment, a separate portion of the memory device interface 320 can be assigned or designated for servicing status polling communications. In this embodiment, a status polling interface 326 can be established using one or more existing interface pins or by adding an additional interface pins.

Figure 4:
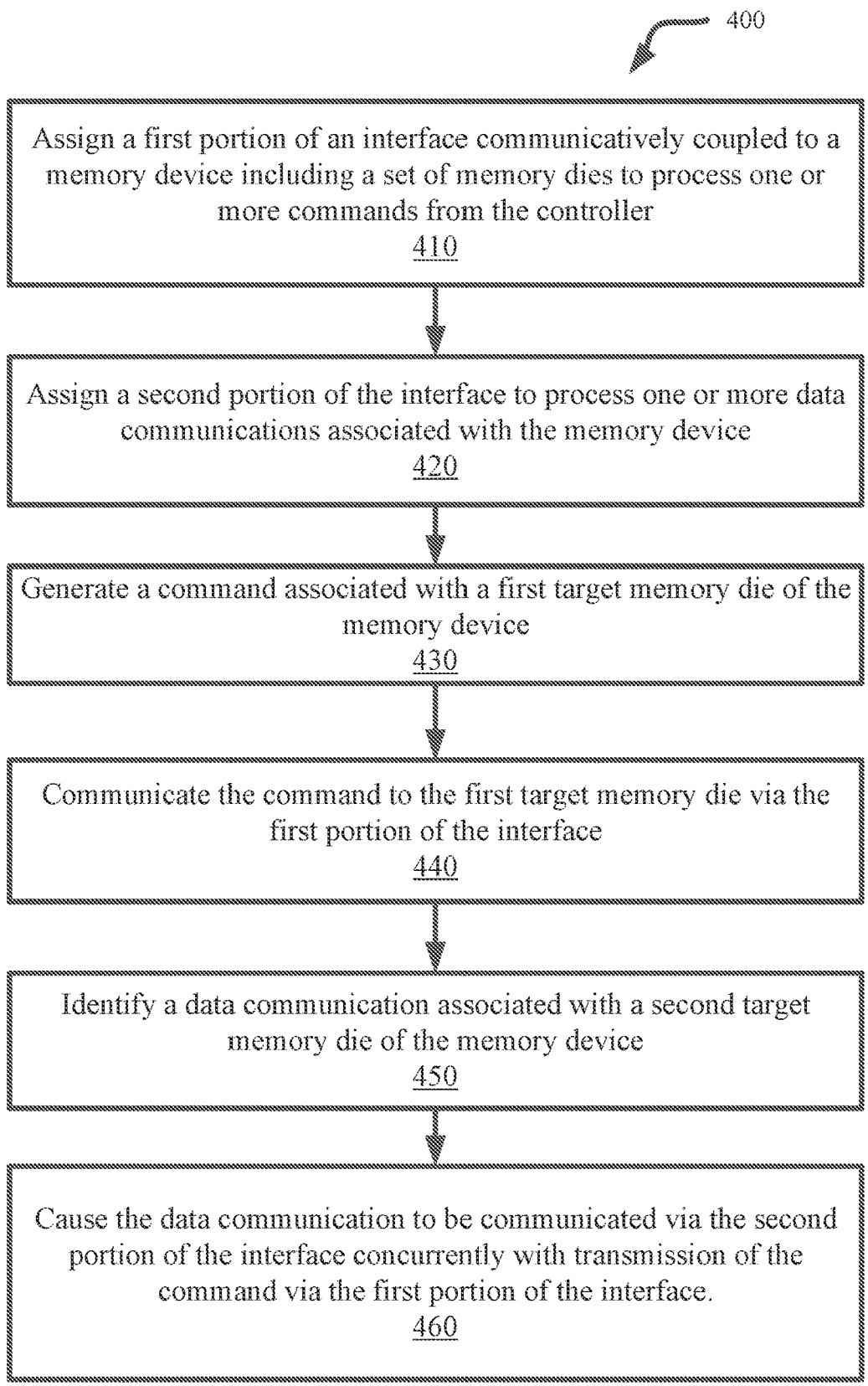
FIG. 4 is a flow diagram of an example method to manage concurrent command communications and data burst communications in accordance with some embodiments of the present disclosure.

FIG. 4 is a flow diagram of an example method 200 to manage concurrent command communications and data burst communications associated with a memory device using a command interface and a data burst interface, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the interface management component 113 of FIG. 1.

At operation 410, a command interface is established. For example, the processing logic of a controller assigns a first portion of an interface communicatively coupled to a memory device including a set of memory dies to process one or more commands from the controller. In an embodiment, the first portion of the interface represents a command interface that is dedicated to servicing controller-initiated commands to the memory device in connection with one or more memory access operations relating to the set of memory dies of the memory device. In an embodiment, the first portion of the interface can be assigned or further dedicated to servicing status polling communications between the controller and the memory device.

At operation 420, a data communication interface is established. For example, the processing logic of the controller assigns a second portion of the interface to process one or more data communications associated with the memory device. In an embodiment, the first portion of the interface (e.g., the command interface 322 of FIG. 3) and the second portion (e.g., the data burst interface 324 of FIG. 3) are independent from one another, thereby allowing the concurrent processing of command and data burst communications.

At operation 430, a command is generated. For example, the processing logic of the controller generates a command associated with a first target memory die of the memory device. In an embodiment, the command can include information relating to the configuration of the first target memory die in connection with a memory access operation (e.g., a read operation, a program operation, etc.) initiated by a host system.

At operation 440, a command is communicated. For example, the processing logic of the controller communicates the command to the first target memory die via the first portion of the interface. In an embodiment, the first command is transmitted using the command interface (e.g., command interface 322 of FIG. 3), without using the portion of the interface associated with the data burst communications (e.g., data burst interface 324 of FIG. 3).

At operation 450, a data communication is identified. For example, the processing logic of the controller identifies a data communication associated with a second target memory die of the memory device. In an embodiment, the first target memory die (e.g., memory die 1 of FIG. 3) and the second target memory die (e.g., memory die 2 of FIG. 3) are two different memory dies within the same memory device (e.g., memory device 340 of FIG. 3). In an embodiment, the data communication associated with the second target memory die can include a data input burst or a data output burst associated with a memory access operation corresponding to the second target memory die.

At operation 460, a command and a data communication are concurrently communicated. For example, the processing logic causes the data communication to be communicated via the second portion of the interface concurrently with transmission of the command via the first portion of the interface. In an embodiment, transmission of the command and the data communication overlap in view of the use of the separate and independent first portion and second portion of the interface. In an embodiment, the data communication can be transmitted concurrently with multiple different commands. In an embodiment, the data communication can be transmitted concurrently with one or more status polling communications that are transmitted via the first portion of the interface or a separate portion of the interface (e.g., a third portion).

Figure 5:
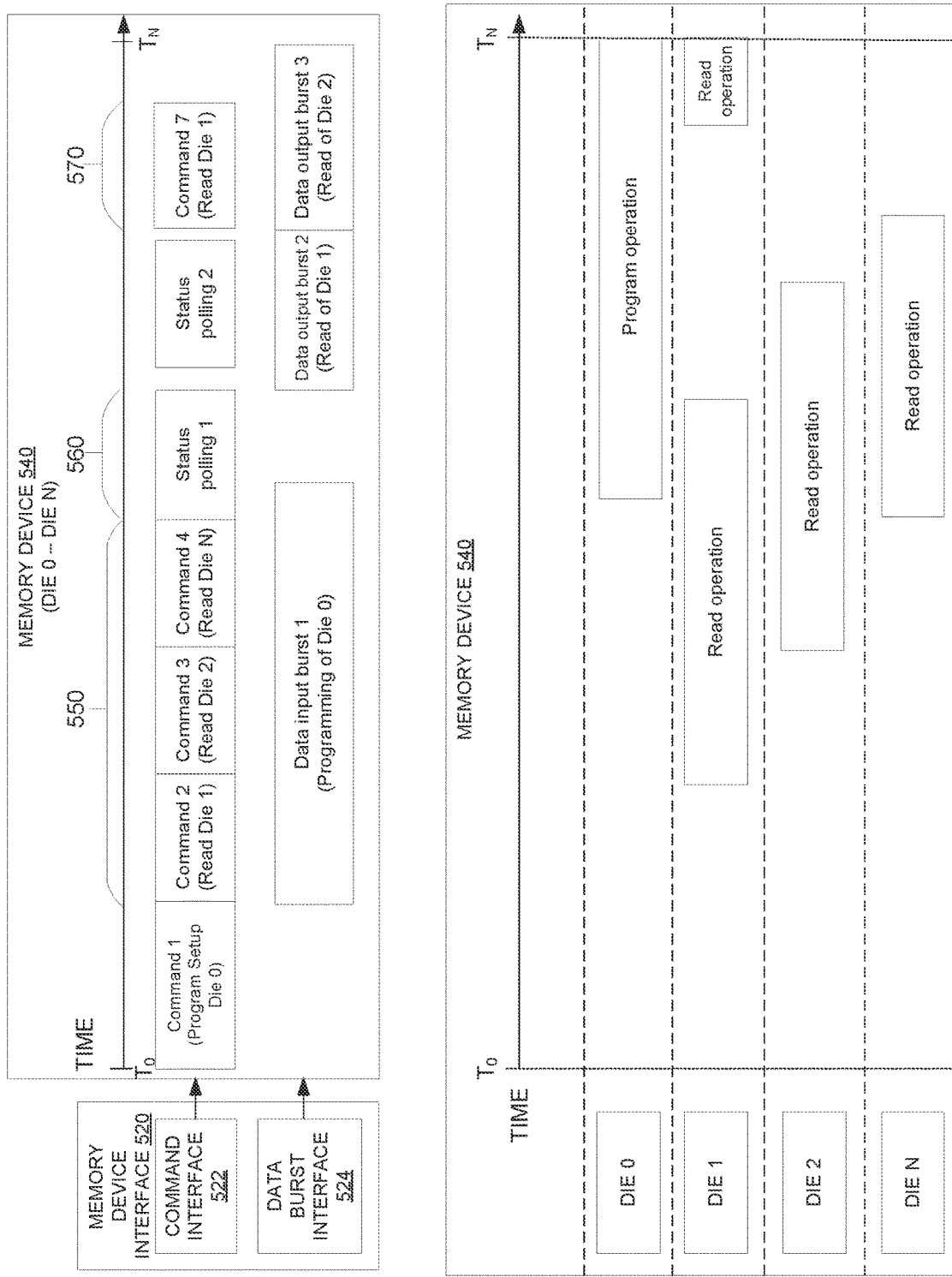
FIG. 5 is an example memory device interface including a command interface for communicating commands to a memory device in accordance with some embodiments of the present disclosure.

FIG. 5 illustrates an example memory device interface 520 including a command interface 522 for communicating commands to a memory device 540 including a set of memory dies (e.g., Die 0, Die 1, Die 2 . . . Die N). The memory device interface 520 also includes a data burst interface 524 for communicating data bursts between the memory device 540 and a host system.

FIG. 5 further depicts an example timeline (e.g., Time 0 (To) to Time N (TN) associated with the operation of the memory device 540. It is noted that the blocks corresponding to the commands, status polling, and data bursts may not be to scale as it relates to the timeline. During the time line, one or more host-initiated memory access operations (e.g., a program operation associated with Die 0, a first read operation associated with Die 1, a read operation associated with Die 2, a read operation associated with Die N, and a second read operation associated with Die 1) can be identified by a controller managing the memory device interface 520. For each memory access operation, a target memory die can be identified. In connection with the memory access operations, the controller sends a command to the corresponding target memory die via the command interface 522. For example, command 1 (e.g., a program setup command) is sent via the command interface 522 to Die 0 in connection with the program operation to be executed on Die 0, followed by a transmission of command 2 via the command interface 522 to Die 1 in connection with the first read operation to be executed on Die 1, followed by a transmission of command 3 via the command interface 522 to Die 2 in connection with the read operation to be executed on Die 2, and so on.

In an embodiment, the controller causes the transmission of one or more data bursts to the memory device 540 in connection with the memory access operations via the data burst interface 524. For example, data input burst 1 is transmitted via the data burst interface 524 to Die 0 in connection with the programming operation of Die 0, data output burst 2 is transmitted from Die 1 via the data burst interface 524 in connection with the first read operation of Die 1, and data output burst 3 is transmitted from Die 2 via the data burst interface 524 in connection with the read operation of Die 2.

As shown in FIG. 5, during a first time period 550, multiple commands (e.g., command 2, command 3, and command 4) are concurrently communicated with a data burst (e.g., data input burst 1). In an embodiment, one or more status polling communications (e.g., status polling 1 and status polling 2) can be sent to the memory device 540 via the command interface 522. As shown in FIG. 5, during a second time period 560, a status polling communication (e.g., status polling 1) is concurrently communicated with a data burst (e.g., data input burst 1). In an embodiment, during a third time period 570, a further status polling communication (e.g., status polling 2) is concurrently communicated with a data burst (e.g., data output burst 2).

In this regard, one or more commands can be issued during a data burst and status polling can be performed in parallel with one or more data bursts. Advantageously, as illustrated in FIG. 5, the parallel issuance of commands and processing of status polling communications with data bursts enables improved processing speeds of the memory access operations associated with the memory dies of the memory device 540.

Figure 6:
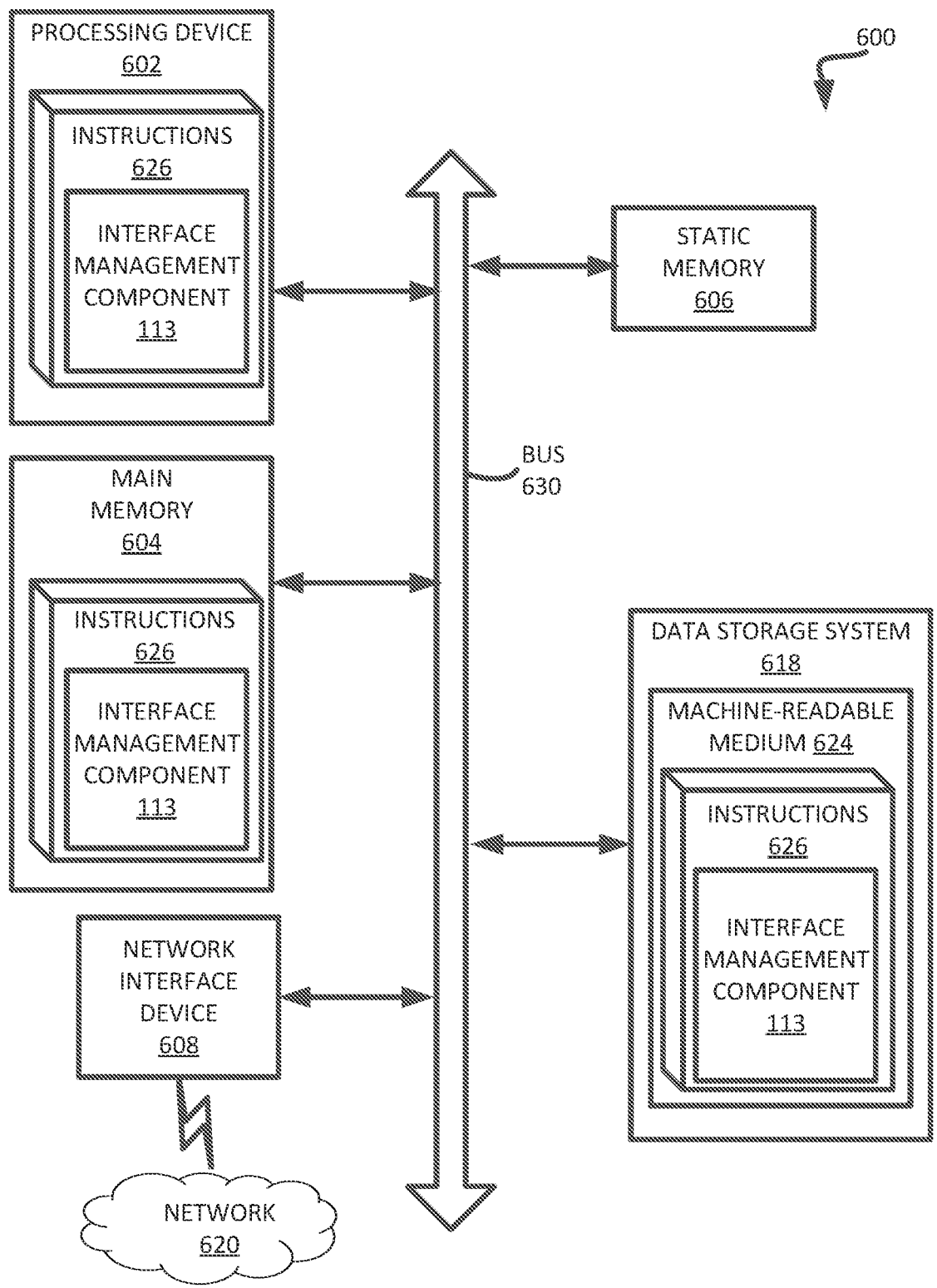
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan threshold management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a selective relocation component (e.g., the interface management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   communicating, by a controller, a first access command to a first memory device via a command interface portion of a memory device interface;
   communicating a second access command to second memory device via the command interface portion of the memory device interface;
   causing communication of a data burst between the controller and the first memory device corresponding to the first access command via a data burst interface portion of the memory device interface; and
   communicating a status polling communication via the memory device interface, wherein the status polling communication is communicated via the memory device interface concurrently with the data burst via the data burst interface portion of the memory device interface.

2. The method of claim 1, further comprising designating one or more pin locations as the command interface portion of the memory device interface.

3. The method of claim 1 wherein the memory device interface comprises interface pins, and wherein the command interface portion comprises a first set of interface pins and the data burst interface portion comprise a second set of interface pins.

4. The method of claim 3 wherein communicating the status polling communication comprises communicating the status polling communication via the command interface portion of the memory device interface.

5. The method of claim 3 wherein communicating the status polling communication comprises communicating the status polling communication via one or more interface pins that are different from the first and second sets of interface pins.

6. The method of claim 5, further comprising designating one or more pins of the memory device interface as the one or more interface pins to communicate the status polling communication.

7. The method of claim 1 wherein the command interface portion of the memory device interface comprises an address latch enable pin, a command latch enable pin, and a write enable pin.

8. The method of claim 1 wherein command interface portion and the data burst interface portion of the memory device interface are independent from one another.

9. A system, comprising:
   a plurality of memory dies;
   an memory device interface coupled to the plurality of memory dies, the memory device interface including a command interface portion and a data burst interface portion, the command interface portion configured to communicate memory device commands, and the data burst interface portion configured to communicate data bursts, wherein the command interface portion and the data burst interface portion are independent from one another; and
   a memory sub-system controller coupled to the memory device interface and configured to use the respective command interface portion and data burst interface portion in parallel to communicate one or more commands via the command interface portion and to communicate one or more data bursts via the data burst interface portion concurrently.

10. The system of claim 9 wherein the memory device interface comprises an Open NAND Flash Interface.

11. The system of claim 9 wherein the command interface portion of the memory device interface comprises an address latch enable pin, a command latch enable pin, and a write enable pin.

12. The system of claim 11 wherein the data burst interface portion of the memory device interface comprises data pins.

13. The system of claim 9 wherein the memory device interface comprises one or more pins dedicated to the processing of status polling communications.

14. The system of claim 9 wherein the memory sub-system controller comprises a interface management component configured to cause concurrent transmission of the one or more commands via the command interface portion and the one or more data bursts via the data burst interface portion.

15. The system of claim 9 wherein the plurality of memory dies, the memory device interface, and the memory sub-system controller are included in a solid state drive.

16. A non-transitory computer readable medium comprising instructions, which when executed by a processing device, cause the processing device to perform operations comprising:
generating a status polling communication associated with a first memory die of a plurality of memory dies coupled to a memory device interface, the memory device interface comprising:
a command interface portion configured to communicate one or more commands; and
a data burst portion configured to communicate one or more data bursts; and
communicating the status polling communication via the memory device interface concurrently with a data burst via the data burst interface portion of the memory device interface.

17. The non-transitory computer readable medium of claim 16 wherein the data burst via the data burst interface portion of the memory device interface comprises a data burst associated with a memory access operation to a second memory die of the plurality of memory dies.

18. The non-transitory computer readable medium of claim 16 wherein the command interface portion includes an address latch enable pin, a command latch enable pin, and a write enable pin.

19. The non-transitory computer readable medium of claim 16 wherein communicating the status polling communication via the memory device interface comprises communicating the status polling communication via command interface portion of the memory device interface.

20. The non-transitory computer readable medium of claim 16 wherein the memory device interface further includes a status polling interface portion, and wherein communicating the status polling communication via the memory device interface comprises communicating the status polling communication via status polling interface portion of the memory device interface.

* * * * *